(12) United States Patent
Einav

(10) Patent No.: US 6,720,617 B2
(45) Date of Patent: Apr. 13, 2004

(54) THIN FILM FIELD EFFECT TRANSISTOR

(75) Inventor: Moshe Einav, Kfar Uriya (IL)

(73) Assignee: Nanogate Ltd. (IL)

( * ) Notice: Subject to any disclaimer, the term of this patent is extended or adjusted under 35 U.S.C. 154(b) by 388 days.

(21) Appl. No.: 09/863,838

(22) Filed: May 23, 2001

(65) Prior Publication Data
US 2002/0000619 A1 Jan. 3, 2002

(30) Foreign Application Priority Data
May 25, 2000 (GB) .............................................. 0012798

(51) Int. Cl.⁷ .......................... H01L 29/76; H01L 29/94; H01L 31/062; H01L 31/113; H01L 31/119
(52) U.S. Cl. .......................... 257/332; 257/329; 257/330; 257/331
(58) Field of Search .................................. 257/329, 330, 257/331, 332, 334

(56) References Cited

U.S. PATENT DOCUMENTS

| 4,003,036 A | * | 1/1977 | Jenne | 365/182 |
| 4,250,519 A | * | 2/1981 | Mogi et al. | 257/302 |
| 4,272,302 A | * | 6/1981 | Jhabvala | 438/271 |
| 4,335,450 A | * | 6/1982 | Thomas | 365/182 |
| 4,420,379 A | * | 12/1983 | Tonnel | 438/271 |
| 4,503,449 A | * | 3/1985 | David et al. | 257/330 |
| 4,697,201 A | * | 9/1987 | Mihara | 257/330 |
| 5,229,310 A | | 7/1993 | Sivan | 437/41 |
| 5,270,968 A | | 12/1993 | Kim et al. | 365/182 |
| 5,340,759 A | | 8/1994 | Hsieh et al. | 437/41 |
| 5,523,600 A | | 6/1996 | Kapoor | 257/377 |
| 5,739,057 A | | 4/1998 | Tiwari et al. | 438/156 |
| 5,757,038 A | | 5/1998 | Tiwari et al. | 257/192 |
| 5,780,327 A | | 7/1998 | Chu et al. | 438/156 |
| 5,834,798 A | | 11/1998 | Kang | 257/67 |

FOREIGN PATENT DOCUMENTS

| EP | 0 487 083 | 5/1992 |
| EP | 0 872 895 | 10/1998 |

* cited by examiner

Primary Examiner—Ngân V. Ngô
(74) Attorney, Agent, or Firm—Ladas & Parry

(57) ABSTRACT

A thin film semiconductor-on-insulator FET and a method of its fabrication are presented. The FET comprises a substantially vertically extending semiconductor channel formed between two, parallel, horizontally extending source and drain electrodes. A lower one of the source and drain electrodes is formed in a groove made in the surface of an insulator substrate. The semiconductor channel is defined by a super structure of semiconductor layers located within a periphery region of a conical-shaped structure which is surrounded by an insulator layer located above the lower electrode, the tip of the conical-shaped structure being in contact with this electrode. A gate electrode on gate oxide is located within a central region of the conical-shaped structure. The other upper one of the source and drain electrodes is associated with the base of the conical-shaped structure extending in a plane parallel to the lower electrode.

9 Claims, 7 Drawing Sheets

THIN FILM FIELD EFFECT TRANSISTOR

FIELD OF THE INVENTION

This invention relates to a thin film field effect transistor and a method of its manufacture, aimed at improving the characteristics of the transistor and an integrated circuit utilizing the same.

BACKGROUND OF THE INVENTION

A thin film field effect transistor (FET) typically consists of source and drain electrodes interconnected by semiconductor material. Conduction between the drain and source electrodes occurs basically within the semiconductor, and the length between the source and drain is the conduction channel. Thin film field effect transistors are widely used in systems where it is desirable to have relatively high output currents and high-speed operations referred to as the operating frequency. These two depend largely on the length of the current conduction channel. In particular, the output current is inversely proportional to the channel length, while the operating frequency is inversely proportional to the square of the channel length.

The basic metal-oxide-semiconductor field-effect transistor (MOSFET) structure has a so-called "flat design", as illustrated in FIG. 1. A FET structure 1 is a four-terminal device and consists of a p-type semiconductor substrate 2, into which two n-regions 3, a source electrode 4 and drain electrode 5 are formed (e.g., by ion implantation). The metal contact on the insulator is called gate 6. Heavily doped polysilicon or a combination of silicide and polysilicon can also be used as the gate electrode. The basic device parameters are the channel length L, which is the distance between the two metallurgical n-p junctions, the channel width W, the gate oxide thickness t, the junction depth, and the substrate doping. When voltage is applied to the gate, the source-to-drain electrodes correspond to two p-n junctions connected back to back. The only current that can flow from source to drain is the reverse leakage current. When a sufficiently positive bias is applied to the gate so that a surface inversion layer (or channel) is formed between the two n-regions, the source and the drain are connected by the conducting surface of the n-channel through which a large current can flow. The conductance of this channel can be modulated by varying the gate voltage. This back surface contact (or substrate contact) can have the reference voltage or be reverse-biased: the back surface voltage will also affect the channel conductance.

It is a constant trend of the industry towards higher integration, higher operation frequency, low energy consumption and lower production costs. Those goals were achieved by the constant reduction of the lithographic base line, whose width determines the channel length, the source and drain portals, the conductor's cross-section dimension, and, in brief, the size of the transistor. The gate length determines the frequency or speed of operation, which is strictly dependent on lithographic skill. The state of the art is a line of 180 nm width.

This shrinking in size forced the transistors to be in very close proximity to each other on the flat wafer of silicon. This high density of devices raised some serious problems, including cross-talk between adjacent devices; heating of the chip at operation because of the high frequency along with a high length-to-width ratio of conduction lines and channels; high production costs caused by extremely strict demands for a very clean room and sophisticated photolithography equipment. These problems limit the present fabrication technology.

To solve the above problems, the following solutions were achieved in the art: The use of X-ray or e-beam lithography enables to obtain high integration, however it lacks industrial performance. High frequency is achieved by reducing the gate length with a vertical channel structure. This concept is disclosed in U.S. Pat. Nos. 5,340,759; 5,739,057; 5,780,327; 5.757,038. The best result of about 30 nm gate length can be achieved by the technique disclosed in U.S. Pat. No. 5,757,038, wherein selective wet etching procedures are induced on different semiconductor materials, while the substrate is a semiconductor. By enlarging the width-to-length ratio, low energy consumption can be obtained. This is accomplished by dual gate structure also disclosed in the above patents. The best result for a width-to-length ratio of about 50 can be achieved by the technique disclosed in U.S. Pat. No. 5,757,038. With regard to U.S. Pat. No. 5,340,759, is can be calculated using the parameters indicated therein that this technique could provide an even higher width-to-length ratio (about 80). However, it utilizes a design of silicon wafer on an insulator substrate, and a thin gate channel is produced by an epitaxial process at 750° C. Moreover, Chemical Vapor Deposition is used for applying polysilicon to form a drain layer. The thickness of the thin gate oxide is about 60A.

SUMMARY OF THE INVENTION

There is accordingly a need in the art to improve the manufacture of FET and its structure to provide better operational characteristics of the FET and an electronic circuit utilizing the same.

The present invention provides a FET structure that enables to obtain a larger width-to-length ratio of the semiconductor channel (as compared to the conventional FET structure), having increased operational frequency and low energy consumption. The FET structure of the invention is characterized by sharp-phase edges of p-n junction layers, thereby improving the performance of the semiconductor device. The FET structure enables a significant reduction in cross-talk between two locally adjacent FETs.

A method of manufacturing FETs according to the invention allows for providing a vertically arranged array of FETs, thereby enabling a large number of FETs within the same footprint. The method allows for significantly simplifying the requirements of the manufacture of FET, namely eliminating the need for a "clean room", allowing low temperature conditions, and reducing the number of fabricating steps.

The main idea of the present invention consists of the following: A FET according to the invention is in the form of a conical-shaped structure, which is made in an insulator layer, and has its tip in contact with a lower electrode (source or drain) layer, preferably located in the interior of this layer. A semiconductor channel is defined by a super structure of semiconductor layers (of n-p-n or p-n-p type), occupying a periphery region of the cone, thereby providing a desirably large width-to-length ratio of the channel. A central region of the cone is a gate electrode on a gate oxide layer. The uppermost electrode (drain or source) is associated with the cone base at least partly covering the uppermost semiconductor layer. The entire FET-structure is surrounded by an insulator.

The FET according to the invention utilizes Semiconductor-on-Insulator or Metal-on Insulator technology to form a structure of the source/drain electrode on an insulator substrate, which is then covered by the insulator layer carrying another layer of active devices.

There is thus provided according to one aspect of the invention, a FET comprising a source electrode, a drain electrode, a gate electrode on a gate oxide, and a semiconductor channel, wherein a lower one of the source and drain electrodes is formed in a groove made in the surface of an insulator substrate;

the semiconductor channel is defined by a super structure of semiconductor layers located within a periphery region of a conical-shaped structure which is immersed in an insulator layer located above the lower electrode, the tip of the conical-shaped structure being in contact with said lower electrode;

said gate electrode on the gate oxide is located within a central region of said conical-shaped structure; and the other, upper one of the source and drain electrodes is associated with the base of said conical-shaped structure extending in a plane parallel to said lower electrode.

A plurality of such transistors forming an active layer of second semiconductor devices can be vertically arranged, being separated by insulator.

To manufacture the above FET-structure, all operations (being low temperature operations) are performed in a high vacuum chamber. A groove is formed in the surface of an, insulator substrate, e.g., SiO$_2$, by Lithography and Plasma Etching. The groove is filled with at least one electrically or light conductive material (semiconductor and/or metal), serving as the lower electrode (source or drain), by deposition. The surface of the entire structure (the substrate-with-electrode) is polished by Ion Beam Polishing, to remove the residuals of the conductive material, and a further insulator layer is deposited thereon by Physical or Chemical Vapor Deposition. A conical-shaped pit is cut off through the upper insulator layer, in such a manner that the tip of the pit is in contact with the lower electrode (located in the interior thereof or directly thereabove). The layers of the semiconductor super structure are sequentially deposited into the pit, by CVD or PVD techniques, for example Molecular Beam Epitaxy, Ion Deposition, Cluster Beam Deposition, Ion Assisted Evaporation, etc. Then, a conical shaped opening is produced in the conical shaped pit filled with the semiconductor layers, and its walls are covered with an insulator gate oxide in which the gate electrode is then formed.

Thus, according to another aspect of the present invention, there is provided a method of fabricating FET having a source electrode, a drain electrode, a gate electrode on a gate oxide, and a semiconductor channel, the method utilizing low temperature processes conducted in a high vacuum chamber, and comprising the steps of:

(a) forming a lower one of the source and drain electrodes in a groove made in the surface of an insulator substrate;

(b) polishing the surface of a structure obtained in step (a);

(c) forming an insulator layer on the surface of the polished structure;

(d) forming a substantially conical-shaped structure in said insulator layer, having its tip portion in contact with said lower electrode, wherein a periphery region of said conical-shaped structure is a super structure of semiconductor layers defining said semiconductor channel, and a central region of said cone is said gate electrode on the gate oxide;

(e) forming the other, upper one of said source and drain electrodes at least partly extending in a plane parallel to said lower electrode;

(f) polishing the surface of a structure obtained in step (e);

(g) covering the entire surface of the polished structure obtained in step (e) by a field oxide layer.

Preferably, the formation of the conical-shaped structure comprises the following steps:

forming a substantially conical-shaped pit in the insulator layer and the lower electrode, such that the tip of the cone is in contact with the lower electrode;

sequentially depositing into said conical-shaped pit semiconductor materials from which said semiconductor channel is to be formed, so as to form a stack structure inside the pit;

forming a substantially conical-shaped opening in said stack structure, thereby forming said super structure located within the periphery region of said conical-shaped pit;

forming said gate electrode on the gate oxide inside said conical-shaped opening.

The insulator layer underlying the upper electrode also covers surface regions surrounding the conical-shaped structure. To form the upper electrode, this insulator layer is patterned to form a groove from the uppermost semiconductor layer away from the conical-shaped structure. This groove is then filled with the upper electrode material.

Obviously, the above method can be used for fabricating an array of horizontally arranged transistors. To form an array of vertically arranged transistors, the entire structure obtained in step (g) is polished, and steps (a) to (g) are repeated.

Preferably, the method also comprises the step of depositing diamond and metal layers on the entire surface of the field-oxide covered and polished structure. The presence of these layers enables the heat dissipation and the grounding of a static charge.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
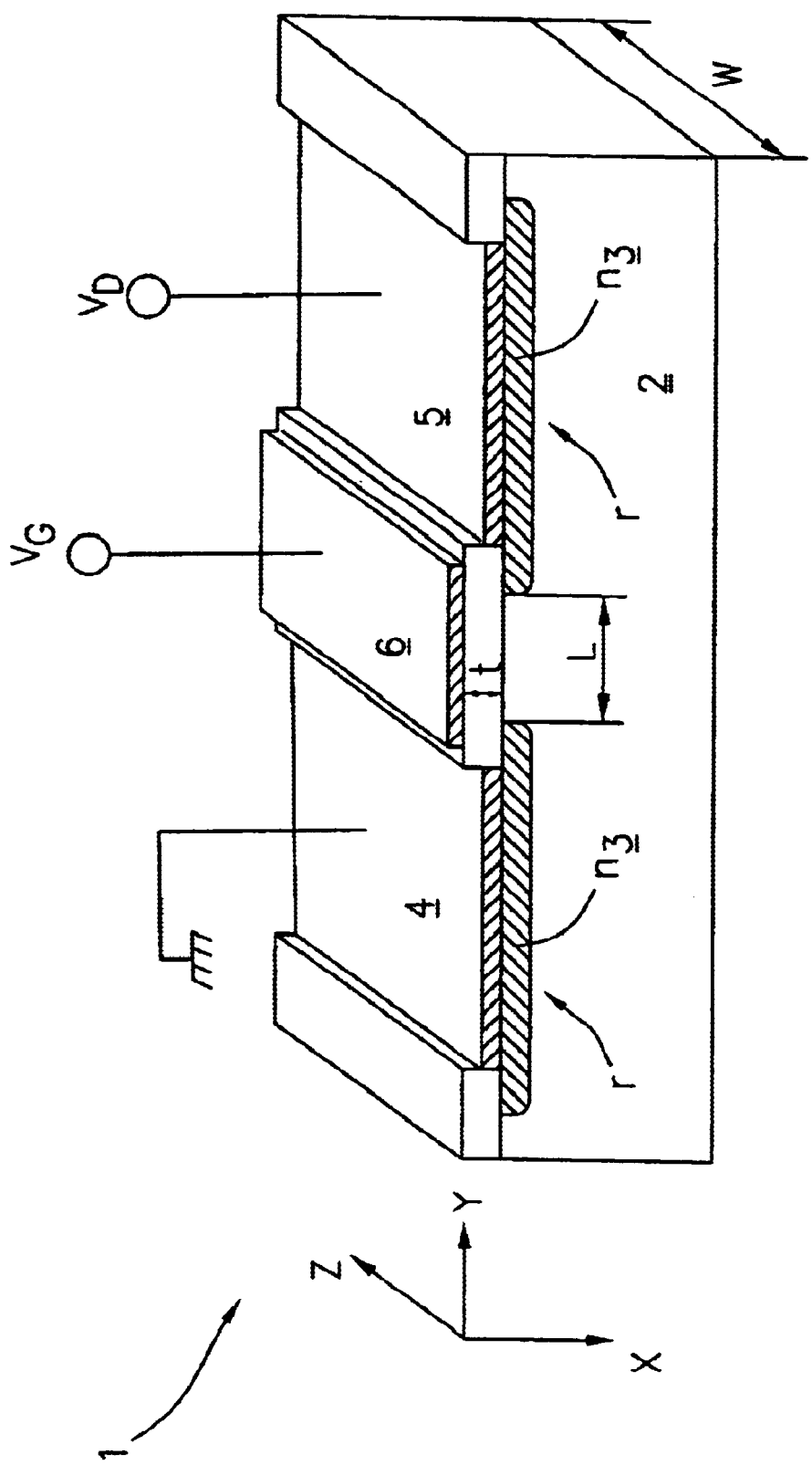
FIG. 1 is the base structure of a conventional MOSFET.

FIG. 1 illustrates the base structure of the conventional MOSFET.

Figure 2A:
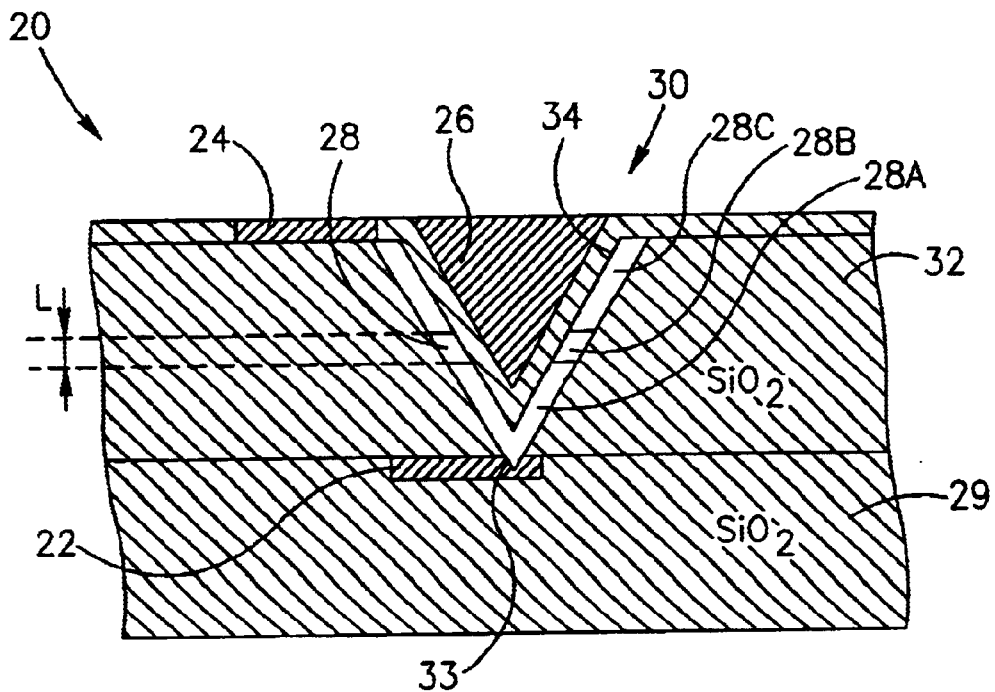
FIGS. 2a and 2b are top and cross-sectional side views, respectively, of a FET constructed according to one embodiment of the invention.
Figure 2B:
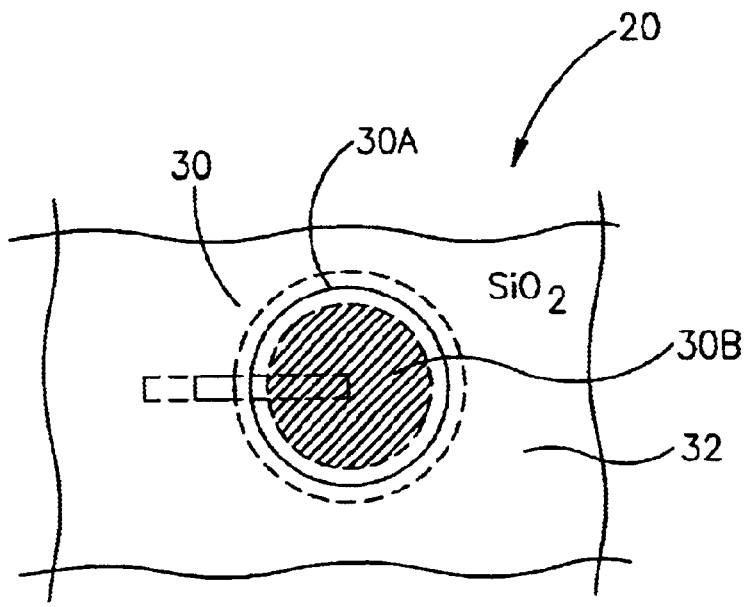

Referring to FIGS. 2a and 2b, there is illustrated a FET structure, generally designated 20, designed according to the invention. The FET 20 is composed of a source electrode 22, a drain electrode 24, a gate electrode 26, and a semiconductor channel 28. The source electrode 22 is a metal or semiconductor layer (i.e., electrically or light conducting material) on an insulator substrate 29. The semiconductor channel 28 is a super structure of three semiconductor layers 28a, 28b and 28c of n-, p-, n-conductivity, respectively (or p-, n-, and p-conductivity, as the case may be). As shown, this super structure 28 and the gate electrode 26 form together a conical-shaped structure 30 surrounded by an insulator (e.g. $SiO_2$) layer 32, wherein the semiconductor channel 28 is located within a periphery region 30a (FIG. 2b) of the structure and the gate electrode 26 is located within its central region 30b. In other words, the semiconductor channel encloses the gate electrode 26, which is typically in the form of a gate electrode on a gate oxide 34 (e.g. $SiO_2$). The tip 33 of the conical-shaped structure 30 is located in the interior of the source layer 22. The source and drain electrodes 22 and 24 are located in parallel planes at the tip and base portions, respectively, of the conical-shaped structure 30, and are spaced-apart from each other by the insulator layer 32. It should be noted that the tip 33 of the structure 30 could be located directly above the source electrode 22 contacting it.

The channel 28 has the length L defined by the thickness of the intermediate layer 28b and the width W defined by the diameter of the cone 30 within this layer. This construction of the FET-structure 20 provides a higher width-to-length ratio (about 100) within a small area (about 0.25 $\mu m^2$) occupied by the entire FET structure, as compared to that of the conventional FET design illustrated in FIG. 1. Moreover, enclosure of the semiconductor channel in the insulator decreases cross talk between locally adjacent transistors.

Figure 3A:
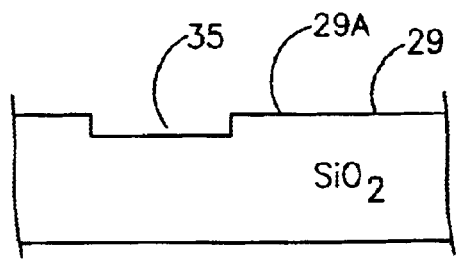
FIGS. 3a to 3j illustrate the main operational steps of a method of manufacturing of the transistor of FIGS. 2a–2b.

The manufacture of the FET structure 20 will now be described with reference to FIGS. 3a–3h. The insulator substrate layer 29 (e.g., $SiO_2$) is positioned in a vacuum chamber (not shown). Then, a groove 35 is formed in the surface 29a of the substrate layer 29 (FIG. 3a). To this end, a Lithography followed by Plasma Etching is used. The groove 35 may have a rectangular or circular cross-section, the rectangular groove being shown in the example of FIGS. 2a–2b.

Figure 3B:
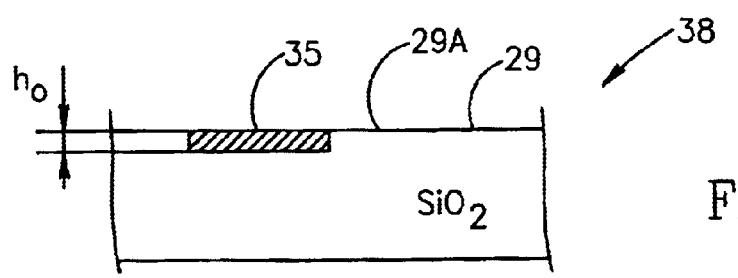
Figure 3C:
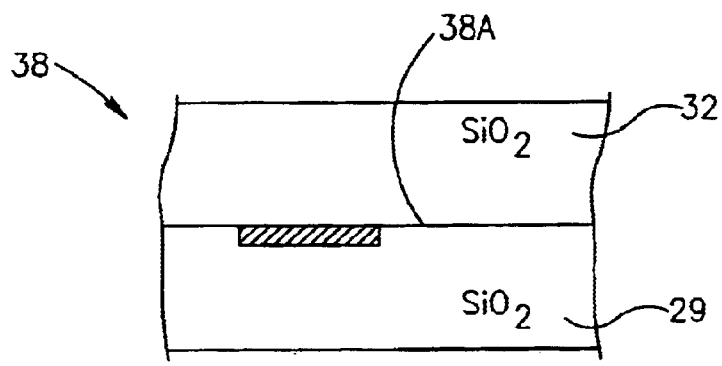

A conductive material is deposited into the groove 35. This conductive material may be metal or semiconductor, for example polysilicon, and serves as the source (or drain) electrode 22 (FIG. 3b). The thickness $h_0$ of the source layer may be about 0.5 $\mu$m. The substrate-with-electrode structure 38 is thus obtained having a surface 38A formed by the surface of the substrate layer and the surface of the source electrode.

It should be noted, although not specifically shown, that the groove may be filled with a stack of a thin metal layer covered by semiconductor layer or vice versa. Several transistors can have a common source, and/or a common drain, as will be described further below with reference to FIGS. 5a and 5b. It should also be noted that the lower electrode 22 could serve as a drain electrode, while the upper electrode 24 (FIG. 2a) as a source electrode.

Preferably, the surface 38A of the structure 38 is polished by Ion Beam Polishing, so as to remove residuals of the source material from the surface of the substrate layer 29. Then, the insulator layer 32 (i.e., $SiO_2$) is deposited on the surface 38a of the so-obtained structure 38. Deposition of the source and insulator layers may be performed by the PVD technique or low-temperature CVD technique (in the presence of plasma and high vacuum conditions).

Figure 3D:
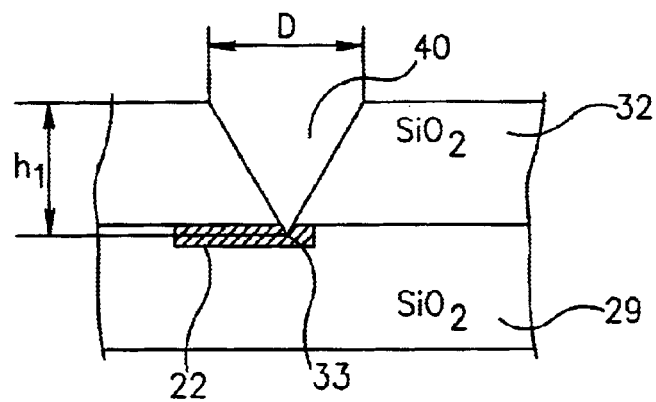

Thereafter, a conical-shaped pit 40 is cut off through the insulator layer 32, such that the tip 33 of the pit is in contact with the source layer 22 (FIG. 3d). In the present example, the tip is located inside the layer 22. It should, however, be noted that the location of the tip directly above the source 22 is sufficient for the purposes of the present invention. The pit 40 can be fabricated by photolithography followed by reactive Ion Etching, or ECR Ion Etching, and is therefore of 0.18 $\mu$m in size or less according to the state of the art lithography technology. The height $h_1$ of the pit 40, as well as the diameter D at its base is about 0.25 $\mu$m.

Figure 3E:
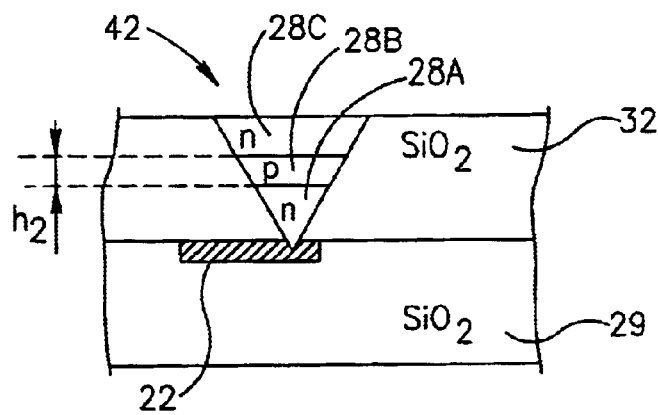
Figure 3F:
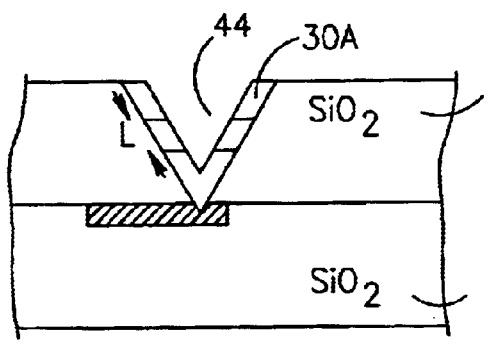
Figure 3G:
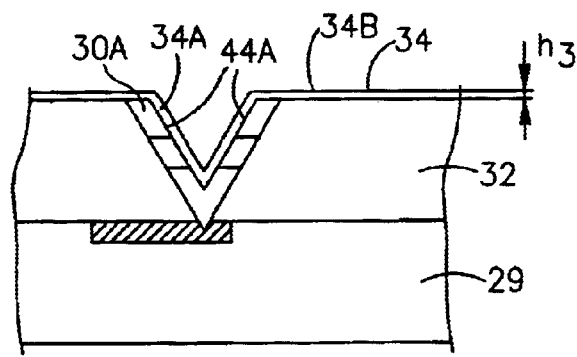

Three semiconductor layers 28a, 28b and 28c are sequentially deposited into the pit 40, for example by Ion Assisted technique (for example, with the use of argon or an inert gas), Molecular Beam Epitaxy (MBE) technique or Low temperature CVD techniques. The thickness $h_2$ of the intermediate layer 28b defines the length L of the channel 28, which can be a few nanometers (FIG. 3e). It should be understood that the deposition of the first semiconductor atoms into the tip portion 33 of the pit 40, which is in contact with the source layer 22, will result in the growth of a single crystal in this region.

The sequential deposition of the semiconductor layers may be performed by continuously depositing a common semiconductor material (Si, GaAs, CdSe, InP, Ge, ZnO, ZnS, etc.) and performing timely separated n- and p-doping procedures. A stack super structure 42 of the semiconductor layers is thus provided inside the pit 40.

A further manufacturing step consists of making a conical-shaped opening 44 in the super structure 42 (FIG. 3f), for example, by utilizing the same mask used for the production of the pit 40. By this, the periphery region 30a of the conical-shaped structure (30 in FIG. 2b), in the form of the semiconductor layers stack, is provided.

The entire surface of the region 30a is coated with the gate oxide 34 (FIG. 3g), which has a region thereof 34a covering walls 44a (i.e., circumference) of the opening 44, and regions 34b surrounding the opening 44. This is performed by low pressure Chemical Vapor Deposition (LPCVD) or PVD technique. The thickness $h_3$ of the layer 34 can range between a few angstroms and 100 nm.

Figure 3H:
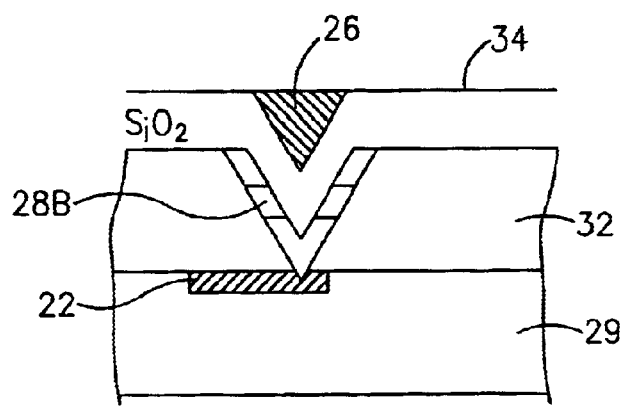

It should be noted, that the insulator coating 34a of the walls 44a may be performed in a two-step process: (1) filling the entire conical-shaped opening 44 with the insulator, and (2) making a further conical-shaped, concentric opening in the insulator region inside the opening 44. As shown in FIG. 3h, in this case, the gate electrode is then deposited into the opening, such that the tip of the conical-shaped gate electrode is brought to a certain depth sufficient for affecting the channel region with an electrostatic tip field effect. This approach enables to significantly reduce parasitic capacitance and oxide damages.

Figure 3I:
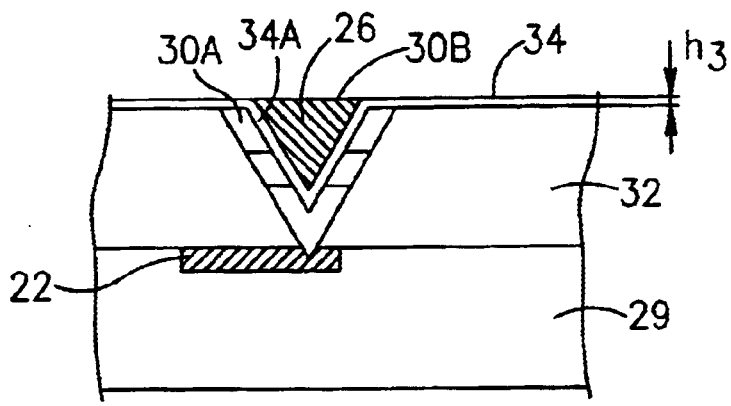
Figure 3J:
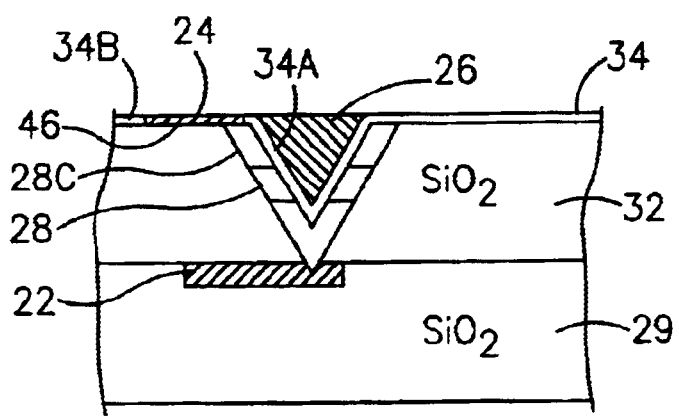

The gate electrode 26 is deposited above the insulator region 32a (FIG. 3i) to fill the opening 44, thereby defining the center region 30a of the conical-shaped structure (30 in FIG. 2a). Then, the insulator layer 34 is patterned in its region 34b, so as to form a groove 46 starting from the region above the uppermost semiconductor layer 28c (FIG. 3j). The groove 46 is then filled with the drain conductive layer 24. The patterning and filling procedures can be implemented in one step.

At this stage, the external surface of the so-obtained structure undergoes polishing by Ion Beam Polishing. Covering of the upper surface of the entire structure with an insulator layer (e.g. $SiO_2$) completes the FET-structure 20.

It should be noted, although not specifically shown, that in order to make contacts to the source, drain and gate electrodes, interconnects are patterned within the insulator layers containing regions. The contacts are made in accordance with the layout of the entire integrated circuit, of which this FET 20 is the constructional part.

The present invention utilizes manufacturing techniques, which can be carried out at substantially the room temperatures, generally within the range 25–250° C. This approach is based on the concept that each atom is arriving at the substrate, charged with the required kinetic energy. Furthermore, the technique of the present invention enables to obtain the width-to-length ratio about 100, which results in the significant reduction of the voltage supply. Comparing this parameter with that of the prior art techniques, it may be concluded that the present invention allows for 100 times lower voltage supply (due to the fact that the channel length in the transistor of the present invention is reduced by 100, as compared to the prior art). Consequently, the device provides very high operational frequency, about 10000 times higher than that of the conventional FET structure. The very thin channel (a few nano-meters) allows for low energy consumption. The design of the transistors creates sharp-phase edges of the semiconductor channel, thereby improving the performance of the device.

Figure 4:
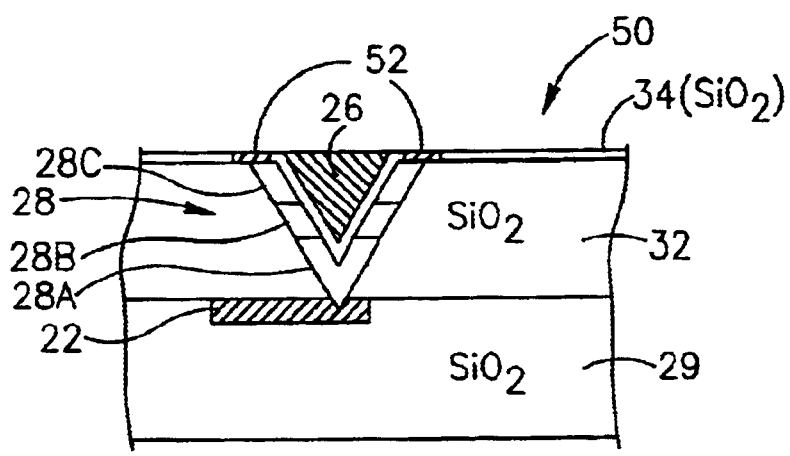
FIG. 4 illustrates a cross-sectional side view of a FET structure according to another embodiment of the invention.

FIG. 4 illustrates a FET structure 50, which is generally similar to the structure 20, but has a somewhat different design of its drain layer 52. To facilitate understanding, the same reference numbers are used for identifying those components, which are common in the structures 20 and 50. As shown, the drain electrode 52 is in the form of a ring at least partly covering the annular surface of the uppermost semiconductor layer 28c.

Figure 5A:
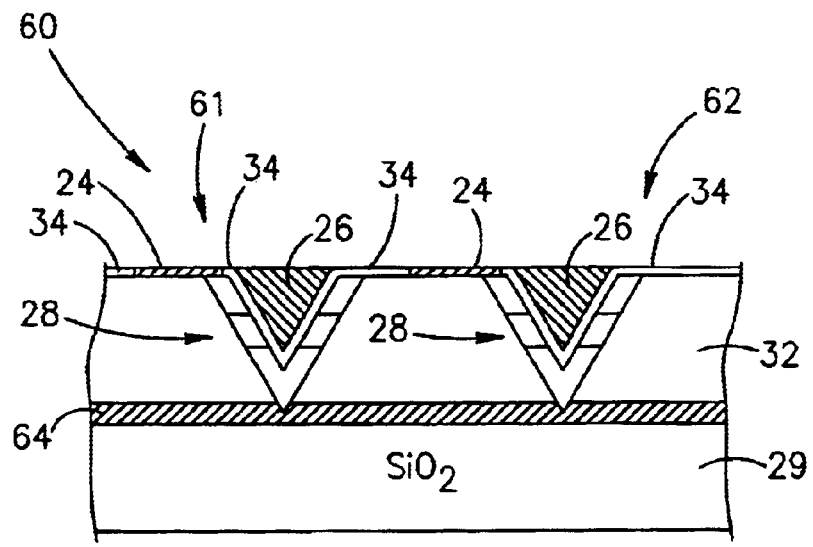
FIGS. 5a and 5b are two more embodiments of the invention, respectively.
Figure 5B:
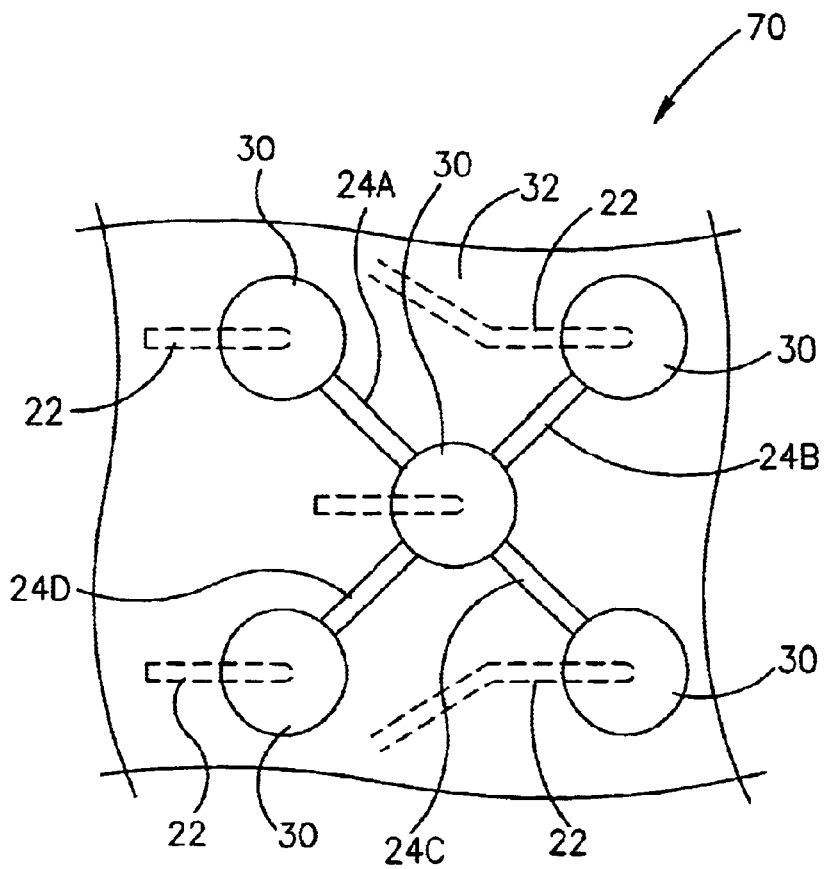

As indicated above, the source and/or drain electrodes may be common for several transistors. FIGS. 5a and 5b illustrate FET structures 60 and 70 utilizing this concept. Similarly, the same reference numbers identify common components in the structures 20, 50, 60 and 70. In the example of FIG. 5a, the FET structure 60 is composed of a horizontal array of transistors—two such transistors 61 and 62 being shown in the figure. The transistors 61 and 62 utilize a common source (or drain) electrode 64. According to the example of FIG. 5b, the FET structure 70 is composed of a horizontal array of transistors (e.g., five transistors), each having its conical-shaped structure 30 and a source electrode 22. Four drain electrodes 24a, 24b, 24c and 24d connect the semiconductor channel (not shown) of one conical-shaped structure with four other structures, respectively.

Figure 6:
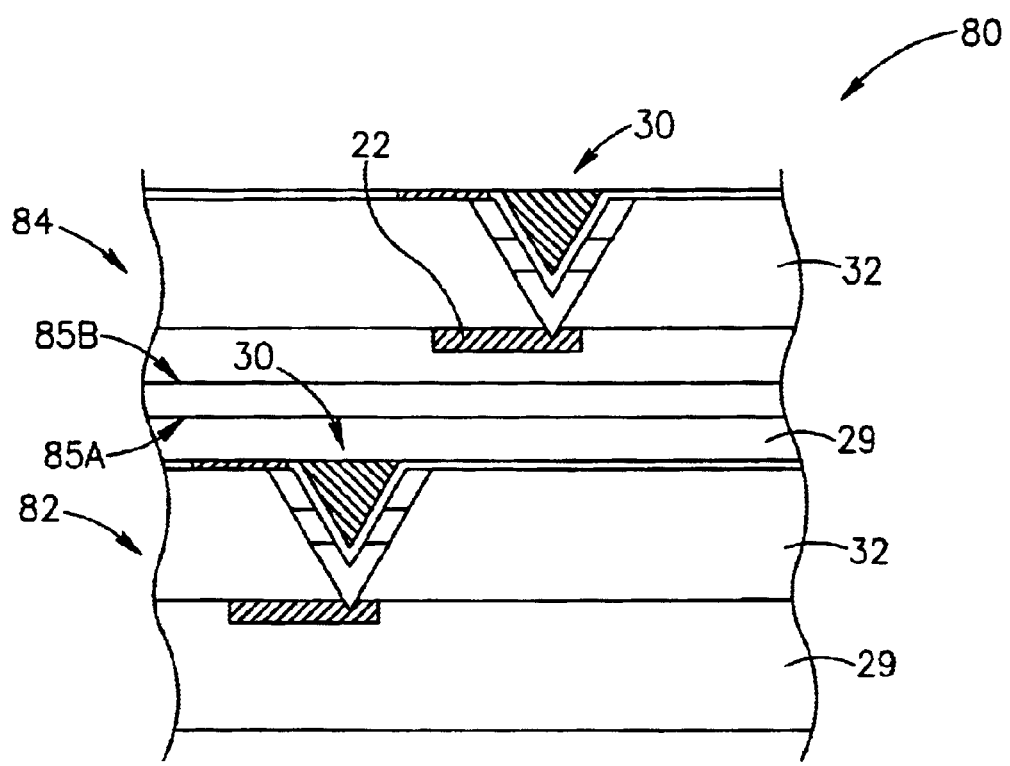
FIG. 6 illustrates a structure composed of two vertically aligned FETs, constructed according to the invention.

Turning now to FIG. 6, there is partly illustrated an integrated circuit 80 utilizing a vertical array of FET-structures-two in the present example 82 and 84, each constructed as described above, namely having the conical-shaped structure 30 surrounded by the insulator layer 32 and carried by insulator substrate 29. As shown, two layers—a diamond layer 85A covered by a metal layer 85B, are formed on the entire surface of the polished field-oxide layer 29 between the FET structure 82 and 84. The presence of these layers 85A and 85B enables the heat dissipation and the grounding of a static charge, respectively.

Those skilled in the art will readily appreciate that various modifications and changes can be applied to the preferred embodiments of the invention as hereinbefore exemplified, as defined in and by the appended claims.

What is claimed is:

1. A field effect transistor (FET) comprising a source electrode, a drain electrode, a gate electrode on a gate oxide, and a semiconductor channel, wherein
   a lower one of the source and drain electrodes is formed in a groove made in the surface of an insulator substrate;
   the semiconductor channel is defined by a super structure of semiconductor layers located within a periphery region of a conical-shaped structure which is surrounded by an insulator layer located above the lower electrode, the tip of the conical-shaped structure being in contact with said electrode;
   said gate electrode on the gate oxide is located within a central region of said conical-shaped structure; and
   the other upper one of the source and drain electrodes is associated with the base of said conical-shaped structure extending in a plane parallel to said lower electrode.

2. The FET according to claim 1, wherein tie lower electrode is metal.

3. The FET according to claim 1, wherein die electrode formed on the insulator substrate is polysilicon.

4. The FET according to claim 1, wherein the lower electrode is a stack formed by a metal layer coated with a semiconductor layer.

5. The FET according to claim 1, wherein the length of the semiconductor channel is about a few nanometers.

6. The FET according to claim 1, wherein the upper electrode is in the form of a ring at least partly covering the surface of an uppermost one of said semiconductor layers.

7. A semiconductor device comprising at least one FET constructed according to claim 1.

8. The device according to claim 7, wherein a plurality of the transistors are arranged in a vertically aligned array, each two locally adjacent transistors being separated by a separating insulator layer.

9. The device according to claim 8, and also comprising diamond and metal layers below said separating insulator layer.

* * * * *